United States Patent
Ikeda et al.

(10) Patent No.: US 7,791,040 B2
(45) Date of Patent: *Sep. 7, 2010

(54) ION IMPLANTING APPARATUS FOR FORMING ION BEAM SHAPE

(75) Inventors: Minoru Ikeda, Kumamoto (JP); Toshio Iida, Kumamoto (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/219,526

(22) Filed: Jul. 23, 2008

(65) Prior Publication Data

US 2009/0050820 A1    Feb. 26, 2009

(30) Foreign Application Priority Data

Aug. 21, 2007    (JP)    ............................... 2007-214278

(51) Int. Cl.
*G21K 5/04*    (2006.01)

(52) U.S. Cl. ............................... 250/396 R; 250/492.1; 250/492.3; 250/492.21

(58) Field of Classification Search ............. 250/396 R, 250/423 R, 491.1, 492.2, 492.1, 492.21, 492.22, 250/492.3, 493.1, 398; 438/369, 473, 480, 438/506, 471, 478, 479, 514; 427/523, 526; 216/62, 87

See application file for complete search history.

(56) References Cited

U.S. PATENT DOCUMENTS

| | | | | |
|---|---|---|---|---|
| 5,947,053 | A * | 9/1999 | Burnham et al. | ............ 116/208 |
| 6,352,626 | B1 * | 3/2002 | von Zweck | ............ 204/298.04 |
| 6,544,597 | B2 * | 4/2003 | Takahashi et al. | ............ 427/452 |
| 6,855,945 | B1 * | 2/2005 | Silder | ............ 250/505.1 |
| 2004/0149926 | A1 * | 8/2004 | Purser et al. | ............ 250/397 |
| 2005/0056794 | A1 * | 3/2005 | Simmons et al. | ....... 250/492.21 |
| 2006/0022144 | A1 * | 2/2006 | Cha | ............ 250/426 |
| 2007/0152174 | A1 * | 7/2007 | Madokoro et al. | ..... 250/492.21 |

FOREIGN PATENT DOCUMENTS

| | | |
|---|---|---|
| CN | 1329180 A | 1/2002 |
| JP | 3-269940 | 12/1991 |
| JP | 10-25178 | 1/1998 |
| JP | 11-149898 | 6/1999 |
| JP | 11-283552 | 10/1999 |

OTHER PUBLICATIONS

Chinese Office Action for the corresponding Chinese patent application dated Feb. 5, 2010, wtih partial English translation.

* cited by examiner

*Primary Examiner*—Jack I Berman
*Assistant Examiner*—Nicole Ippolito Rausch
(74) *Attorney, Agent, or Firm*—McGinn Intellectual Property Law Group, PLLC

(57) ABSTRACT

Aimed at providing an ion implantation apparatus elongated in period over which failure of a target work, due to deposition and release of ion species typically to and from the inner surface of a through-hole shaping a beam shape of ion beam, may be avoidable, reduced in frequency of exchange of an aperture component, and consequently improved in productivity, an aperture component shaping a beam shape has a taper opposed to the ion beam, in at least a part of inner surface of at least the through-hole, and has a thick thermal-sprayed film formed so as to cover the inner surface and therearound of the through-hole.

20 Claims, 9 Drawing Sheets

PRIOR ART

PRIOR ART

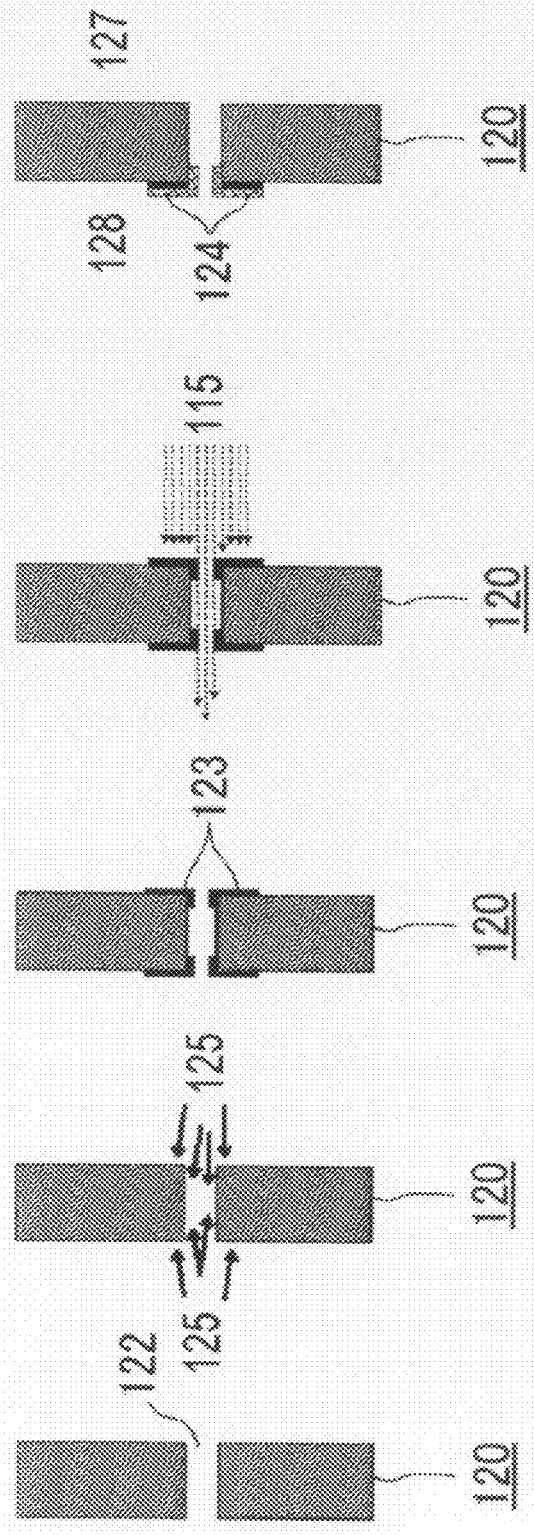

US 7,791,040 B2

ION IMPLANTING APPARATUS FOR FORMING ION BEAM SHAPE

This application is based on Japanese patent application No. 2007-214278 the content of which is incorporated hereinto by reference.

BACKGROUND

1. Technical Field

The present invention relates to an ion implantation apparatus used for implanting ion species into semiconductor wafers or the like by irradiating ion beam, and in particular to an ion implantation apparatus shaping a beam shape by allowing the ion beam to pass through a through-hole of a component.

2. Related Art

At present, ion implantation apparatus is used for implanting ion species into semiconductor wafers. The ion implantation apparatus will be explained below, referring to FIG. 3. The ion implantation apparatus 100 illustrated herein is configured as having an ion gun 110, an aperture component 120, and a wafer holding unit 130 as essential constituents.

The ion gun 110 is supplied with ion species from an ion source (not shown), and emits it in a form of ion beam 115. The aperture component 120 is typically made by machining carbon or graphite, given as a flat-plate main component 121 having a slit like through-hole 122 formed therein.

The wafer holding unit 130 has a rotating stage 131 and a slider mechanism (not shown), wherein a plurality of silicon wafers 140, as target works, are held by the rotating stage 131. The rotating stage 131 allows thus-held plurality of silicon wafers 140 to revolve, and the slider mechanism allows the rotating stage 131 to move in a reciprocating manner typically upward and downward.

In thus-configured ion implantation apparatus 100, an ion beam 115 emitted from the ion gun 110 is allowed to pass through the through-hole 122 of the aperture component 120, during which the beam shape is shaped.

Thus-shaped ion beam 115 is irradiated sequentially to the plurality of silicon wafers 140 revolved by the wafer holding unit 130 and moved upward and downward, so that the ion species is uniformly implanted over the entire surface of the plurality of silicon wafers 140.

The aperture component 120 described in the above may be referred also to as resolving aperture, beam aperture, slit component and so forth, all of which being composed of a flat-plate component having a slit like through-hole 122 formed therein, as shown in FIG. 4.

At present, various proposals have been made on this sort of ion implantation apparatus (for example, Japanese Laid-Open Patent Publication Nos. H10-025178, H11-149898 and H11-283552).

Another proposal has been made on an ion implantation apparatus (not shown), in which at least surficial portions of various components disposed along the path of ion beam are formed using a high-purity silicon. In thus-configured ion implantation apparatus, particles possibly generated as foreign matter out from the components disposed along the path of ion beam should be composed of high-purity silicon, so that the silicon wafers may successfully be prevented from being polluted.

The above-described, high-purity silicon has been disclosed as being typically composed of amorphous silicon deposited on the surface of component by CVD (chemical vapor deposition), amorphous silicon deposited by sputtering, and silicon grown by epitaxial method (for example, Japanese Laid-Open Patent Publication No. H03-269940).

In the ion implantation apparatus 100 described in the above, as shown in FIG. 5, a gas 111 of ion species always stays around the ion beam 115, so that the ion species form a deposited film 116 typically on the inner surface of the through-hole 122 of the aperture component 120 over a long period of use.

The film 116 deposited typically on the inner surface of the through-hole 122 of the aperture component 120 may occasionally drop under irradiation by the ion beam 115 as shown in FIG. 6, and may be transferred as a foreign matter 117 towards the silicon wafers 140.

The silicon wafers 140 under such situation may have the foreign matter 117 deposited on the surfaces thereof, or may have damage on the surfaces thereof due to collision of the foreign matter 117, only to be abandoned anyway.

In particular for the case of large-current-type ion implantation apparatus (not shown), generally composed as a batch system affording a large number, as large as 13, of silicon wafers 140 set therein, occurrence of failure as described in the above may waste a large number of silicon wafers 140 at a time.

The foreign matter possibly generated from the components in the ion implantation apparatus described in Japanese Laid-Open Patent Publication No. 03-269940 might be composed of silicon, but an anticipation still remains in that the collision of the foreign matter may damage the surfaces of silicon wafers. Even if the damage could be avoidable, the silicon foreign matter adhered on the surfaces of the silicon wafers may be causative of failure in the succeeding semiconductor processes.

FIG. 7 and FIG. 8 show an exemplary case having a coated film 123 covering the inner surface of the through-hole 122 and portions therearound of the front surface and the back surface of the aperture component 120.

The coated film 123 is formed typically as a thermal-sprayed film of 100 μm or around, by thermal spraying of silicon 126, wherein the surface thereof is given as a porous rough surface having random irregularities of several micrometers or smaller.

Because the inner surface and therearound of the through-hole 122 of the aperture component 120 of the ion implantation apparatus 100 is covered with the porous coated film 123, the gas 111 of ion species steadily stays around the ion beams 115 may be adsorbed by the porous coated film 123 as shown in FIG. 7.

As a consequence, the ion species may be less likely to deposit typically on the inner surface of the through-hole 122 even after a long period of use, so that the failure of the silicon wafers 140 due to dropping and transfer of the deposited film 116 may be prevented to a desirable degree.

It was however found that, when the coated film 123 was formed by thermal spraying of particles 125 from outside of the through-hole 122, the thermal-sprayed film was formed at around the entrance of the through-hole 122 to a thickness of expected degree (300 μm, for example), whereas formed on the inner wall surface of the through-hole 122 only to a thickness approximately one-third (100 μm, for example) of the expected thickness (FIG. 9C).

This is because the minimum diameter of the through-hole 122 is only as small as ½ to ⅗ of length of the through-hole 122, and also because thermal spraying is available only at a very small angle of spraying of the particles 125 away from the inner wall surface (deep behind the entrance) of the through-hole 122 (FIG. 9B).

It was also found that the aperture component 120 shown in FIG. 9C, attached to the ion implantation apparatus 100 so as to allow the ion beam 115 to pass through the through-hole 122 (FIG. 9D), showed gradual decrease in thickness of the thermal-sprayed film at around the entrance of the through-hole 122 of the aperture component on the ion source side 127, and on the inner wall surface (deep behind the entrance) due to damage given by the ion beam 115 after the elapse of a predetermine length of time, and finally showed exhaustion of the thermal-sprayed film (FIG. 9E). It was found that the thermal-sprayed film remained only at around the exit of the through-hole of the aperture component on the wafer side 128, and that a non-aligned deposited film 124 composed of the ion species and the thermal-sprayed film was formed.

SUMMARY

According to the present invention, there is provided an ion implantation apparatus shaping a beam shape of ion beam by allowing the ion beam to pass through a through-hole of a component, wherein the component has a taper 299 opposed to the ion beam, in at least a part of inner surface of the through-hole on the side of incidence of ion beam, and has a thermal-sprayed film formed so as to cover at least the inner surface of the through-hole including the taper 229.

In the present invention, the taper 229 opposed to the ion beam is provided on the inner surface of the through-hole of the component allowing ion beam to pass therethrough, and the thermal-sprayed film is formed on the inner surface of the through-hole including the taper 229. Accordingly, the ion implantation apparatus having a desirable thermal-sprayed film excellent in uniformity of thickness may be realized.

Because the thermal-sprayed film adsorbs ion species of the ion beam, failure ascribable to dropping of the deposited layer and subsequent transfer thereof towards the wafers may be avoidable over a long period, and thereby the productivity may be improved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 9A to 9E are drawings showing formation of the thermal-sprayed film on the inner surface and therearound of the through-hole of the conventional aperture component, and schematically showing operation of ion implantation.

DETAILED DESCRIPTION

Figure 1:
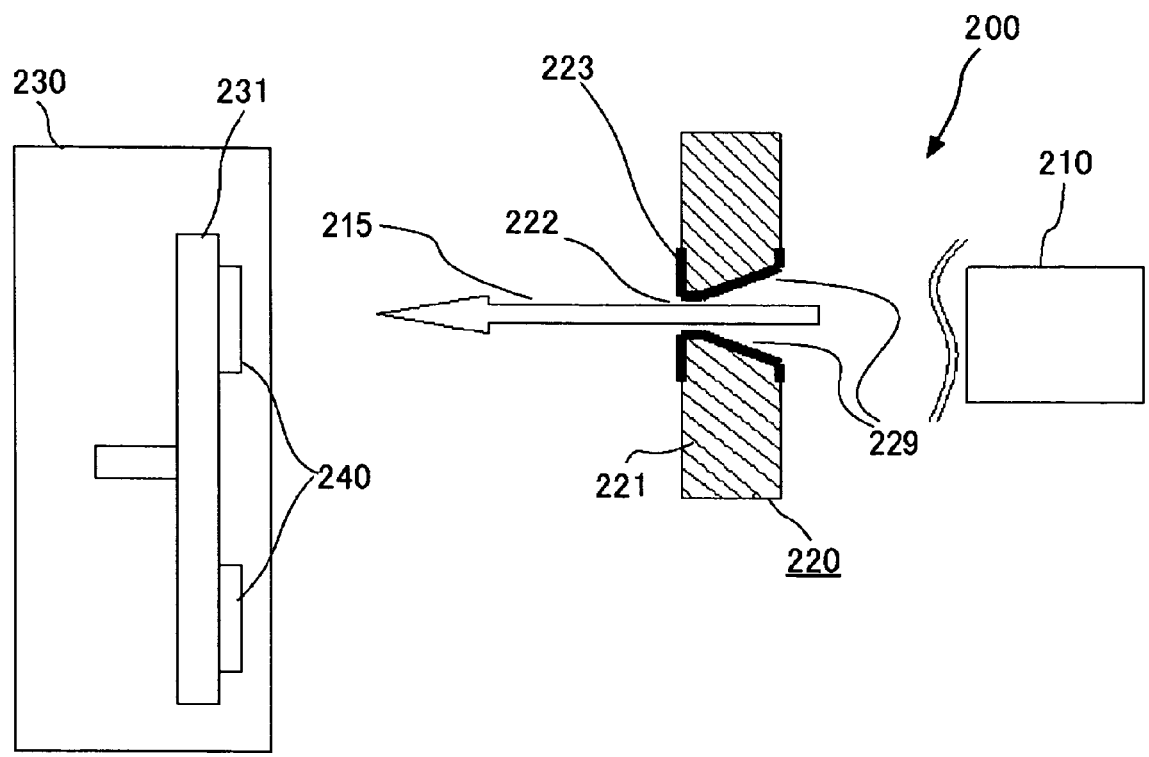
FIG. 1 is a schematic longitudinal sectional view showing an internal structure of an ion implantation apparatus attached with an aperture component according to an embodiment of the present invention.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. It is to be noted that, in all drawings, any similar constituents will be given with similar reference numerals, so that the explanation will not be repeated for simplicity.

An ion implantation apparatus 200 of this embodiment is such as shaping a beam shape of ion beam 215 by allowing it to pass through a through-hole 222 of an aperture component 220, wherein the aperture component 220 has a taper 229 opposed to the ion beam 215, in at least a part of inner surface of the through-hole 222 on the side of incidence of ion beam 215, and has a coated film 223 formed so as to cover at least the inner surface of the through-hole 222 including the taper 229.

The ion implantation apparatus 200 of this embodiment is also configured as having an ion gun 210, an aperture component 220, and a wafer holding unit 230 as essential constituents, wherein the ion gun 210 is supplied with ion species from an ion source (not shown), and emits it in a form of ion beam 215.

As shown in FIG. 1, the wafer holding unit 230 has a rotating stage 231 and a slider mechanism (not shown), wherein the rotating stage 231 allows thus-held plurality of silicon wafers 240 to revolve, and the slider mechanism allows the rotating stage 231 to move in a reciprocating manner typically upward and downward.

The aperture component 220 has a plate like main component 221, and the main component 221 is typically made by machining carbon or graphite. The main component 121 has a slit like through-hole 222 formed therein, wherein the inner surface of the through-hole 222 and portions therearound of the front surface and the back surface of the main component 221 are covered with the coated film 223 which is given as a porous film.

The coated film 223 is typically formed as a thermal-sprayed film to as thick as 300 μm or around, by thermal spraying of silicon, wherein the surface thereof is given as a porous rough surface having random irregularities of several micrometers or smaller.

More details, the coated film 223 has a large number of recesses and a large number of projections formed on the surface thereof, and has a large number of voids formed therein, wherein at least a part of such large number of recesses and at least a part of such large number of voids communicate with each other, and at least a part of such large number of voids communicate with each other.

In addition, the recesses, the projections and the voids of the coated film 223 are formed to as large as several micrometers or smaller, allowing adsorption of ion species of the ion beam 215, but not affective to shaping of the beam shape.

Thus-shaped ion beam 215 is irradiated sequentially to the plurality of silicon wafers 240 revolved by the wafer holding unit 230 and moved upward and downward, so that the ion species is uniformly implanted over the entire surface of the plurality of silicon wafers 240.

Figure 7:
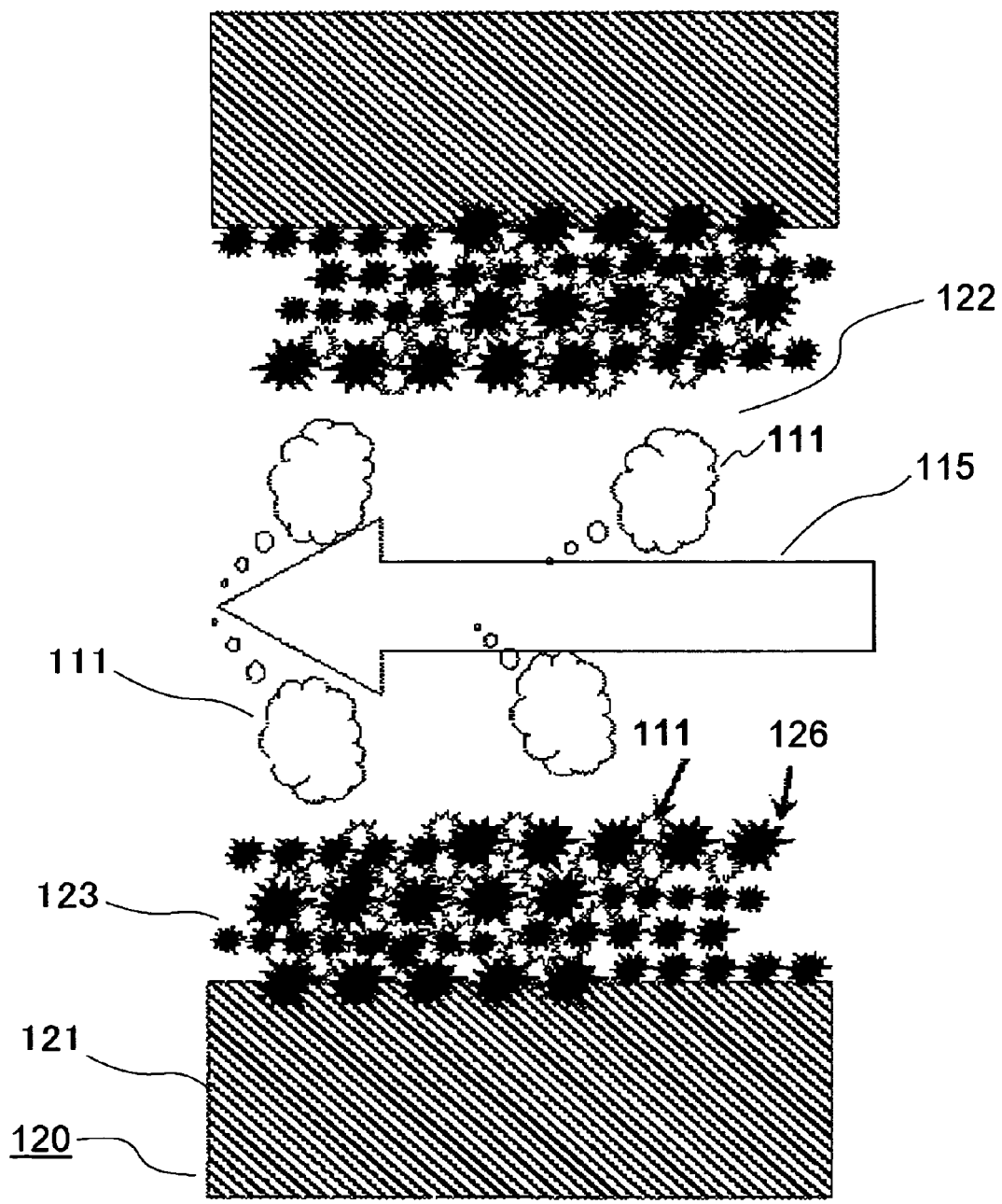
FIG. 7 is a schematic longitudinal sectional view showing a state of adsorption of ion species by a coated film thermally sprayed onto the through-hole of the conventional aperture component.

Because the inner surface and therearound of the through-hole 222 of the aperture component 220 of the ion implantation apparatus 200 of this embodiment is covered with the porous coated film 223, the gas 211 of ion species steadily stays around the ion beams 215 may be adsorbed by the porous coated film 223, similarly to as shown in FIG. 7.

As a consequence, the ion species may be less likely to deposit typically on the inner surface of the through-hole 222 even after a long period of use, so that the failure of the silicon wafers 240 due to dropping and transfer of the deposited film may be prevented to a desirable degree.

What is better, the coated film 223 has a non-aligned structure, so that also the deposited layer of the ion species formed on the surface thereof will have a non-aligned structure. The deposited layer having such non-aligned structure show excellent adhesiveness between the layers. Accordingly, separation of the deposited layer may be prevented to a desirable degree.

The above-described aperture component 220 may preferably be manufactured by forming a main component 221 having, formed therein, the through-hole 222 conforming to the beam shape typically by machining carbon or graphite; and forming a taper 229 opposed to the ion beam 215, in a part of inner surface of the through-hole 222 on the side of incidence of ion beam 215, and forming a coated film 223 given as a porous film by thermal spraying, so as to cover at least the inner surface of the through-hole 222 including the taper 229.

The present inventors actually manufactured a prototype of the above-described ion implantation apparatus 200, and confirmed through our experiment that the number of particles observed on the silicon wafers 240 was reduced to approximately 1/10 of the conventional level. In the experiment, the number of particles adhered to the surface of the silicon wafers 240, and the number of scratches supposedly generated due to collision of the particles were counted.

Moreover, as detailed later, the main component produced typically by machining carbon or graphite has a selectively-aligned crystal structure, so that also the deposited layer grown thereon is supposed to have the selectively-aligned crystal structure which expresses only weak adhesiveness between the layers.

The present inventors then covered the main component composed of carbon or graphite with the coated film composed of thermally-sprayed silicon, incorporated thus-manufactured aperture component into the ion implantation apparatus, and irradiated therethrough the wafers with an ion beam of necessary species, as described in the above.

It was then confirmed that a film having a non-aligned structure deposited and adhered onto the surface of the through-hole of the aperture component, every time the ion implantation took place. Such deposited layer having a non-aligned structure showed extremely large adhesiveness between the layers, as compared with the conventional deposited layer having a selectively-aligned structure. It was therefore confirmed that the aperture component covered, by thermal spraying of silicon, with the coated film having a non-aligned structure successfully prevented separation of the deposited layer.

Although the deposited layer is composed of carbon crystal as described in the above, the ion species contains no carbon. This suggests that the deposited layer is composed of carbon sputtered out from the aperture component irradiated by the ion beam, and the ion species.

Figure 5:
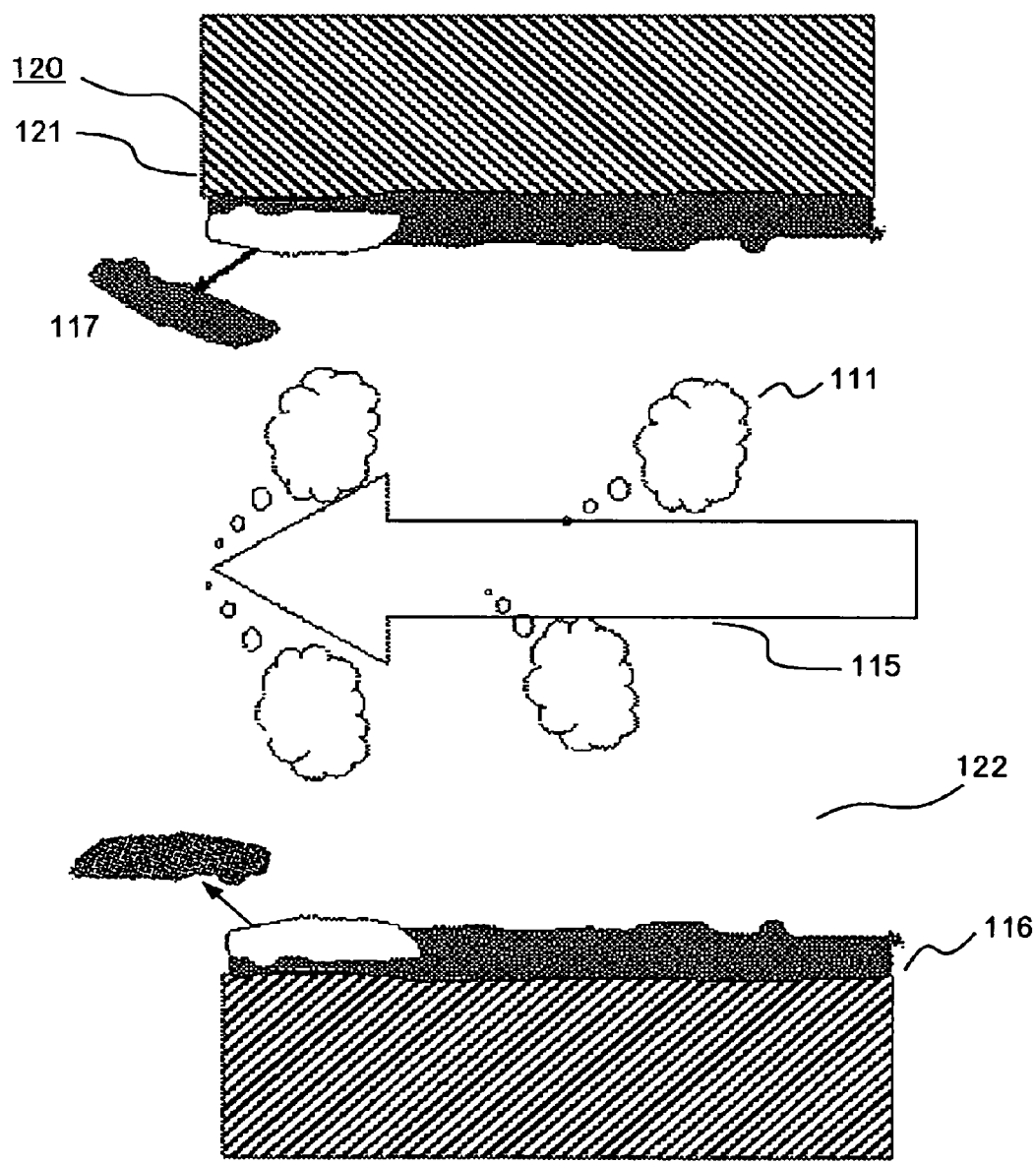
FIG. 5 is a schematic longitudinal sectional view showing generation and dropping of the deposited layer to and from the through-hole of a conventional aperture component.
Figure 6:
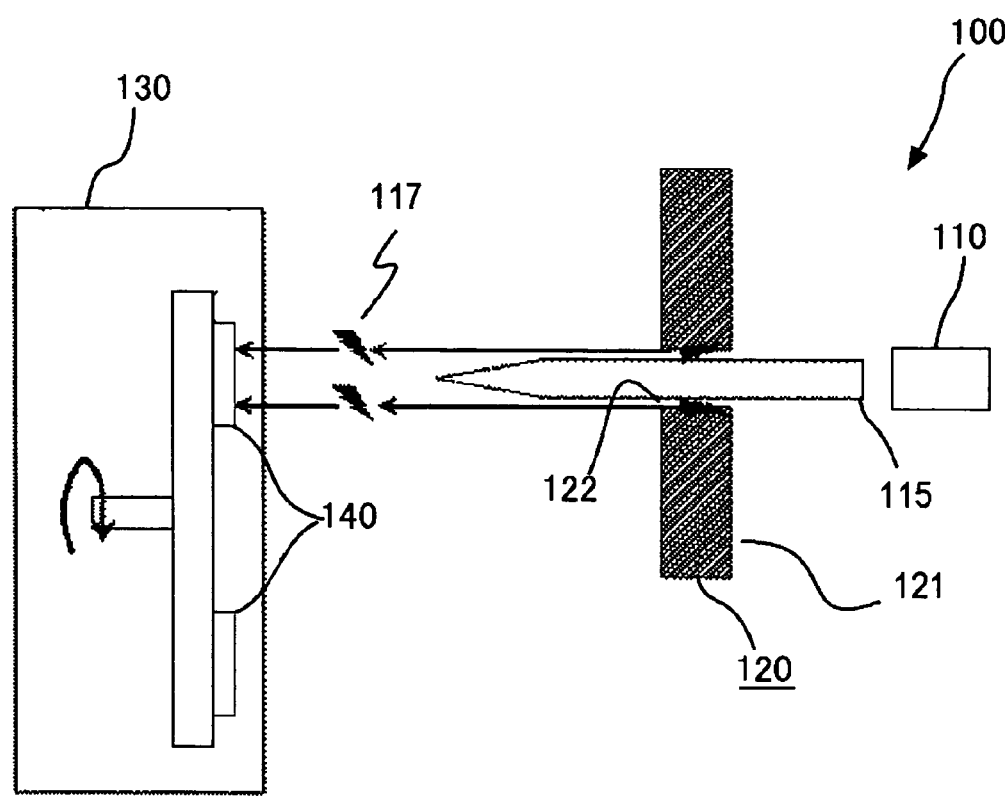
FIG. 6 is a schematic longitudinal sectional view showing a state of transfer of the foreign matter dropped from the conventional aperture component towards the silicon wafers.

Next, operations and effects of this embodiment will be explained. If the diameter of the through-hole of the aperture component is constant, the non-aligned coated film 123 will be exhausted on the incident side as shown in FIG. 9E, and this repetitively raises a problem of deposition and dropping of the ion species and so forth as shown in FIG. 5 and FIG. 6, and the dropped chip may be transferred towards the wafers to pollute them.

For this reason, the aperture component must be replaced with another aperture component having a thermally-sprayed film newly formed thereon, before the thermal-sprayed film on the inner wall of the through-hole of the aperture component is completely exhausted. Interval of the replacement may typically be two weeks, always in need of large cost for another aperture component having a thermal-sprayed film newly formed thereon. Replacement of the aperture component also needs interruption of operation of the ion implantation apparatus, and this inevitably degrades operation efficiency of the apparatus. The problem may consequently form one factor against cost reduction in manufacturing of semiconductor devices.

Figure 8:
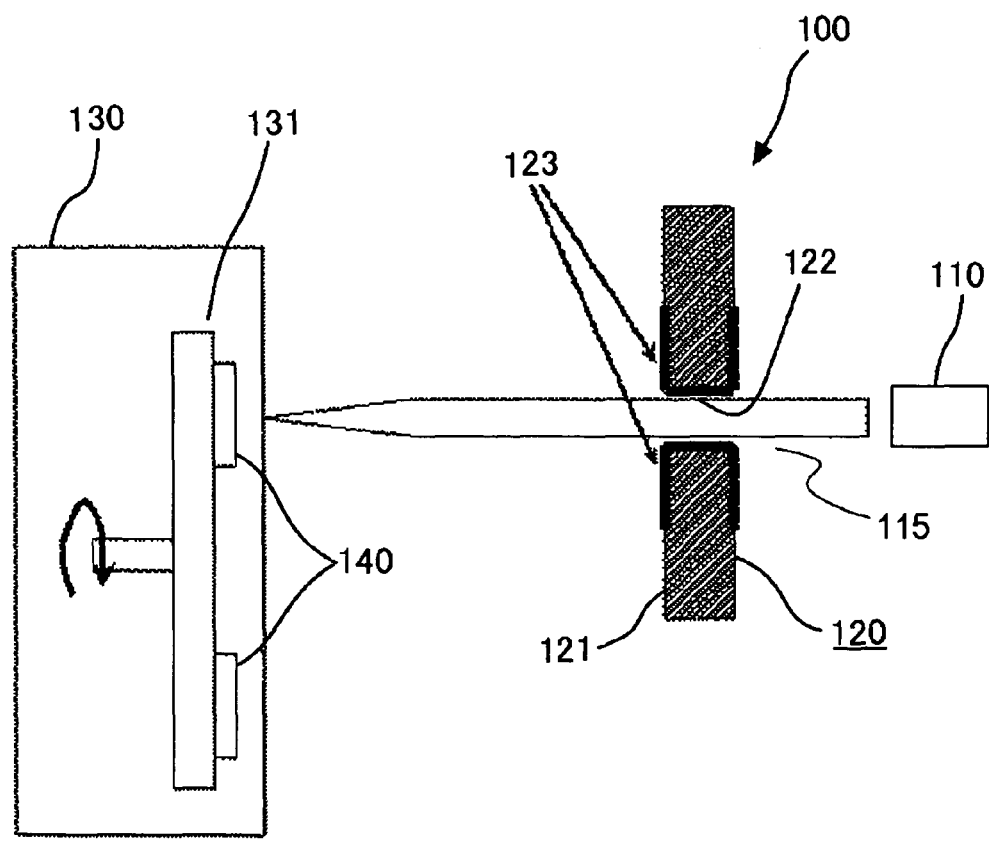
FIG. 8 is a schematic longitudinal sectional view showing an internal structure of an ion implantation apparatus attached with the conventional aperture component.

Aiming at elongating the interval of replacement of the aperture component, the present inventors developed an aperture component capable of allowing the thermal-sprayed film to grow on the inner wall of the through-hole, to a thickness (300 μm, for example) larger than the thickness (100 μm, for example) in the state shown in FIG. 8. One embodiment of our development was shown in FIG. 1 and FIG. 2A-FIG. 2E.

Figure 2:
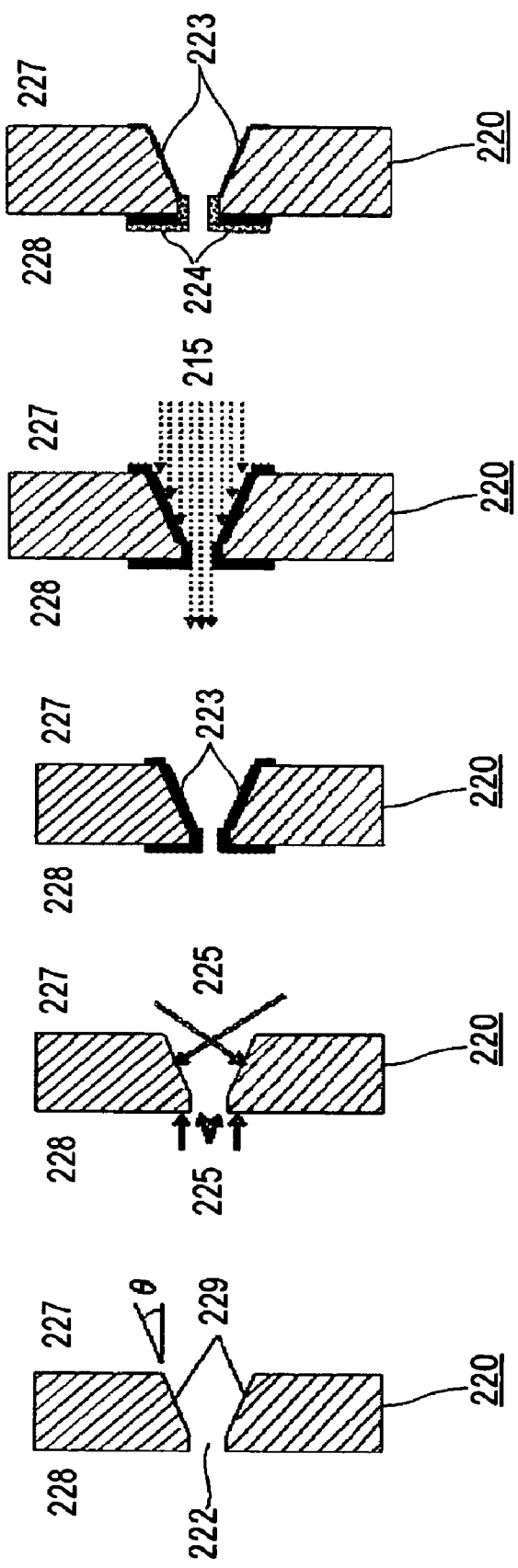
FIGS. 2A to 2E are schematic drawings showing formation of the thermal-sprayed film on the inner surface and therearound of the through-hole of the aperture component according to the embodiment of the present invention, and schematically showing operation of ion implantation.
Figure 3:
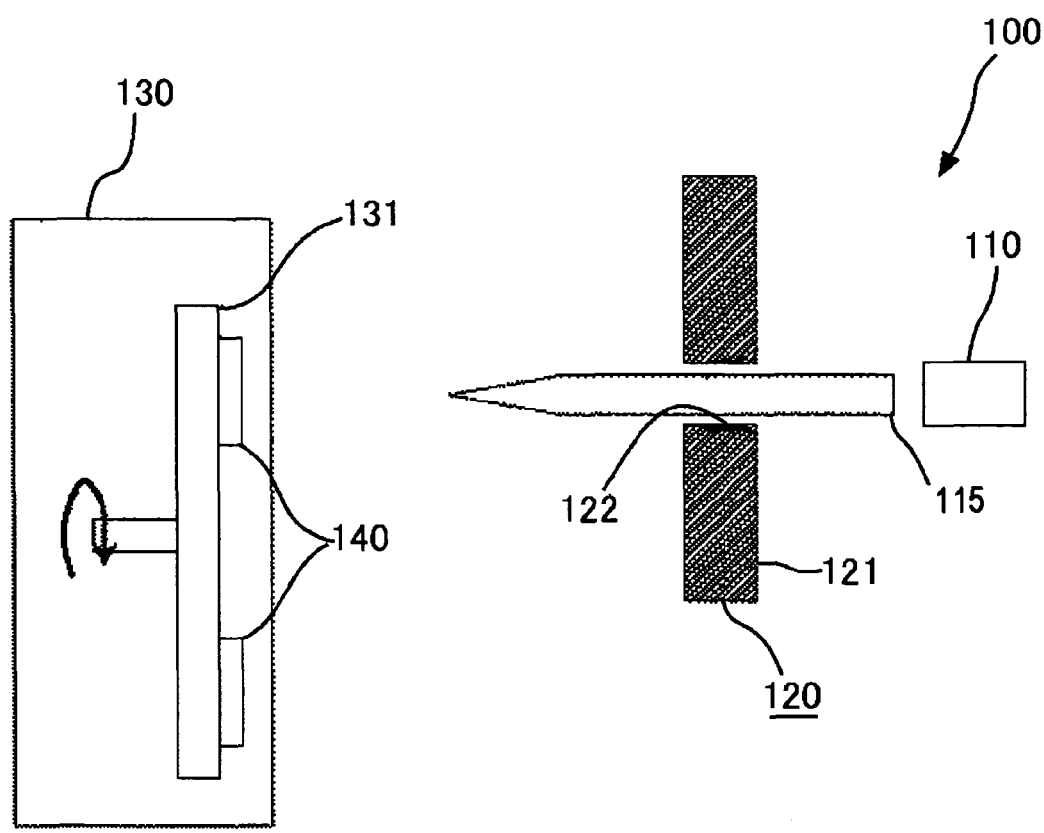
FIG. 3 is a schematic longitudinal sectional view showing an internal structure of an ion implantation apparatus attached with a conventional aperture component.
Figure 4:
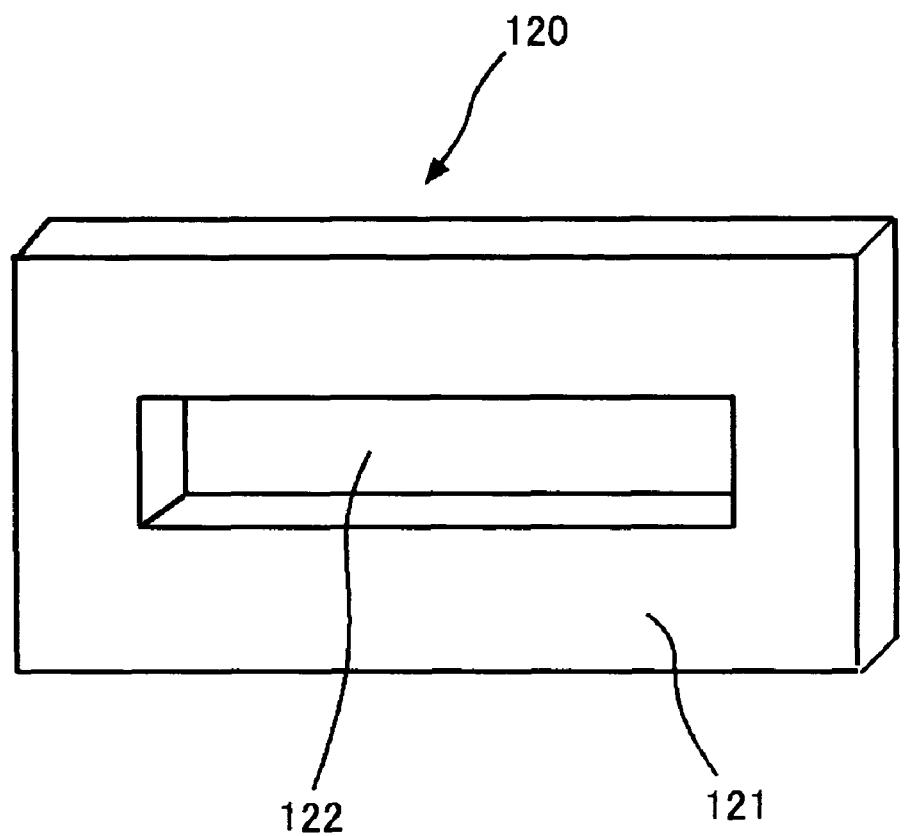
FIG. 4 is a perspective view showing an appearance of an aperture component of the conventional example.

First, the taper 229 is formed, by machining from the ion source side 227, to the through-hole of the aperture component. The angle of taper θ is adjusted typically from 5° to 45°, and preferably from 10° to 40° (FIG. 2). Geometry of the through-hole of the aperture component on the wafer side 228 is remained unchanged from the conventional geometry. Silicon is fused to a liquid state, and sprayed onto the inner wall and therearound of the through-hole of the aperture component, to thereby form the thermal-sprayed film by the adhered thermal-sprayed particles. By providing the taper 229, opposed to ion beam 215, to at least a part of the inner surface of the through-hole, the angle of incidence of the thermal-sprayed particles on the tapered inner surface may be adjustable to as close as 90° (FIG. 2B), and thereby efficiency of thermal spraying may be improved. Silicon may now be thermally sprayed to a thickness (300 μm, for example) (FIG. 2C), larger than the thickness (100 μm, for example) on the inner surface of the through-hole given as shown in FIG. 9C.

FIG. 1 shows an exemplary attachment of the aperture component given as shown in FIG. 2C to the ion implantation apparatus, while directing the widened side of opening having the taper 229 towards the ion source side 227. In the process of ion implantation, the ion beam 215 from an ion source enters the widened side of opening having the taper 229, exits from the narrow side of opening, and implanted to the wafers.

Detail of irradiation of ion beam 215 against the aperture component is shown in FIG. 2D. Operation in this state kept over a long duration of time will gradually thin the thermal-sprayed film on the taper 229, whereas the non-aligned deposited film 224 composed of the ion species and the thermal-sprayed film will deposit on the thermal-sprayed film at around the exit on the wafer side 228 (FIG. 2E). However, the aperture component having the thermal-sprayed film (300 μm thick, for example) shown in FIG. 2C, which is thicker than that (100 μm thick, for example) shown in FIG. 9C, may be elongated in time over which the thermal-sprayed film is exhausted. When compared between the thermal-sprayed film of smaller thickness (100 µm, for example) shown in FIG. 9C and the film of larger thickness (300 µm, for example), the latter may elongate the time over which the thermal-sprayed film is exhausted by approximately three time (equivalent to ratio of thickness of films). The thermal-sprayed film formed on the tapered portion may be increased to 400 µm, if it is allowable from the viewpoint of cost of thermal spraying.

The present invention is not limited to the above-described embodiment, typically showing an exemplary case of using silicon as a material composing the coated film 23, and instead allows adoption of various other materials without departing from the spirit of the present invention, so far as they will not pollute the silicon wafers nor thereby degrade the reliability. For example, tungsten, carbon, aluminum, alumina and so forth may be adoptable.

It is apparent that the present invention is not limited to the above embodiment, that may be modified and changed without departing from the scope and spirit of the invention.

What is claimed is:

1. An ion implantation apparatus, comprising:
   a component, comprising:
      a through-hole through which an ion beam is passed to shape a beam shape of said ion beam;
      a taper having an angled portion opposed to said ion beam at a first part of an inner surface of said through-hole on a side of incidence of said ion beam, and a leveled portion disposed at a second part of said inner surface of said through-hole and at an opposite side of said through-hole from said angled portion; and
      a thermal-sprayed film covering at least the inner surface of said through-hole including said taper.

2. The ion implantation apparatus as claimed in claim 1, wherein said thermal-sprayed film comprises a porous film.

3. The ion implantation apparatus as claimed in claim 2, wherein said porous film comprises:
   a plurality of recesses formed on a surface of the porous film; and
   a plurality of voids formed in said plurality of recesses,
   wherein at least a part of said plurality of recesses communicate with at least a part of said plurality of voids, and
   wherein at least a part of said plurality of voids communicate with each other.

4. The ion implantation apparatus as claimed in claim 3, wherein said recesses and said voids of said porous film allow adsorption of ion species of said ion beam and do not affect said beam shape of said ion beam.

5. The ion implantation apparatus as claimed in claim 2, wherein said porous film comprises a coated film.

6. The ion implantation apparatus as claimed in claim 1, wherein said thermal-sprayed film comprises silicon.

7. The ion implantation apparatus as claimed in claim 1, wherein said thermal-sprayed film comprises tungsten.

8. The ion implantation apparatus as claimed in claim 1, wherein said taper inhibits an erosion of the thermal-sprayed film.

9. The ion implantation apparatus as claimed in claim 1, wherein said angled portion of said taper spreads toward said side of incidence of said ion beam.

10. A component for shaping a beam shape of an ion beam, comprising:
    a through-hole through which said ion beam is passed to shape said beam shape of said ion beam;
    a taper having an angled portion opposed to said ion beam at a first part of an inner surface of said through-hole on a side of incidence of said ion beam, and a leveled portion disposed at a second part of said inner surface of said through-hole and at an opposite side of said through-hole from said angled portion; and
    a thermal-sprayed film covering at least the inner surface of said through-hole including said taper.

11. The component as claimed in claim 10, wherein said thermal-sprayed film comprises a porous film.

12. The component as claimed in claim 11, wherein said porous film has a non-aligned structure.

13. The component as claimed in claim 10, wherein said taper widens said component starting at the through-hole toward the side of incidence of said ion beam.

14. The component as claimed in claim 10, wherein said thermal-sprayed film has a thickness of 400 µm or less.

15. The component as claimed in claim 10, wherein an angle of said taper is in a range from 5° to 45°.

16. The component as claimed in claim 10, wherein an angle of said taper is in a range from 10° to 40°.

17. The component as claimed in claim 10, wherein said thermal-sprayed film comprises thermal-sprayed particles, and
    wherein said thermal-sprayed particles have an angle of incidence on said taper of less than 90°.

18. A method of manufacturing a component for shaping a beam shape of an ion beam, comprising:
    forming a through-hole through which said ion beam is passed to shape the beam shape of said ion beam;
    forming a taper having an angled portion opposed to said ion beam at a first part of an inner surface of said through-hole on a side of incidence of said ion beam, and a leveled portion disposed at a second part of said inner surface of said through-hole and at an opposite side of said through-hole from said angled portion; and
    forming a thermal-sprayed film covering at least the inner surface of said through-hole including said taper.

19. The method of manufacturing a component as claimed in claim 18, wherein said forming said thermal-sprayed film comprises thermal-spraying a porous film.

20. The method of manufacturing a component as claimed in claim 19, wherein said porous film has a non-aligned structure.

* * * * *